(12) United States Patent
Schabel

(10) Patent No.: US 7,352,224 B2
(45) Date of Patent: Apr. 1, 2008

(54) PULSE GENERATOR AND METHOD FOR GENERATING A PULSE TRAIN

(75) Inventor: Stefan Schabel, Syrgenstein (DE)

(73) Assignee: Atmel Germany GmbH, Heilbronn (DE)

( * ) Notice: Subject to any disclaimer, the term of this patent is extended or adjusted under 35 U.S.C. 154(b) by 53 days.

(21) Appl. No.: 11/315,236

(22) Filed: Dec. 23, 2005

(65) Prior Publication Data
US 2006/0139082 A1 Jun. 29, 2006

(30) Foreign Application Priority Data
Dec. 23, 2004 (DE) .................. 10 2004 063 199

(51) Int. Cl.
*G06F 1/04* (2006.01)
*H03K 3/00* (2006.01)

(52) U.S. Cl. .................. 327/291; 327/294; 327/298

(58) Field of Classification Search .......... 327/291, 327/156, 258, 147, 293, 294, 144, 152, 153, 327/161–163, 298
See application file for complete search history.

(56) References Cited

U.S. PATENT DOCUMENTS

| | | | | |
|---|---|---|---|---|
| 6,084,453 A | * | 7/2000 | Fuse et al. .................. | 327/176 |
| 6,137,336 A | * | 10/2000 | Baba et al. .................. | 327/295 |
| 6,388,492 B2 | * | 5/2002 | Miura et al. ................. | 327/291 |
| 6,882,206 B2 | * | 4/2005 | Lawler et al. ............... | 327/291 |
| 7,098,711 B2 | * | 8/2006 | Furuya ........................ | 327/158 |
| 7,233,187 B2 | * | 6/2007 | Vig .............................. | 327/291 |
| 2001/0010475 A1 | | 8/2001 | Miura et al. | |
| 2001/0030565 A1 | | 10/2001 | Ebuchi et al. | |
| 2002/0140486 A1 | * | 10/2002 | Boerstler et al. ............ | 327/291 |

FOREIGN PATENT DOCUMENTS

WO  WO-03/081775 A1  10/2003

* cited by examiner

*Primary Examiner*—Kenneth B. Wells
*Assistant Examiner*—Patrick O'Neil
(74) *Attorney, Agent, or Firm*—Geissler, Olds & Lowe, PLLC

(57) ABSTRACT

A method for generating a pulse train is provided with adjustable start and end times of individual pulses, in which additional clock signals are generated from a 0th clock signal, the signals which in each case have a frequency of the 0th clock signal and whose phase is shifted in each case relative to a phase of the 0th clock signal. Pairs of one first clock signal and one second clock signal are provided, partial pulses are generated from the properties of the first and second clock signal of a pair in accordance with a timing vector, and the pulse train is generated by superimposition of partial pulses.

20 Claims, 3 Drawing Sheets

PULSE GENERATOR AND METHOD FOR GENERATING A PULSE TRAIN

This nonprovisional application claims priority under 35 U.S.C. § 119(a) on Patent Application No. 10 2004 063 199.9, which was filed in Germany on Dec. 23, 2004, and which is herein incorporated by reference.

BACKGROUND OF THE INVENTION

1. Field of the Invention

The invention relates to a method for generating a pulse train with adjustable start times and end times of individual pulses, in which additional clock signals are generated from a 0th clock signal, the signals which in each case have the frequency of the 0th clock signal and whose phase is shifted in each case relative to the phase of the 0th clock signal.

The invention relates further to a pulse generator, which generates additional clock signals from a 0th clock signal, the signals which in each case have the frequency of the 0th clock signal and whose phase is shifted in each case relative to the phase of the 0th clock signal, and the pulse generator generates a pulse train with adjustable start times and end times of individual pulses of the pulse train from the clock signals.

2. Description of the Background Art

Pulse trains of with different adjustable start times and end times are necessary, for example, as a write pulse sequence for the burning of CDs or DVDs. The times must be adjustable for each pulse in the pulse train with an accuracy of, for example, a 16th or a 64th part of the period duration of a write clock signal. The write clock signal corresponds to a 0th clock signal and has, for example, a period duration of 2.4 ns. In a DVD-R write strategy with 16-fold write speed, for this reason, a grid of 16 steps per clock period of the write clock signal is necessary, which results in a time grid pitch of 150 ps. The edges of the write signal must be adjustable with this time resolution.

In principle, such a time resolution can be provided by multiplexer structures with the aforementioned method features and circuit features. Multiplexer structures of this type supply M signals, generated from a write clock signal, to an output circuit. For this purpose, several multiplexers are necessary, because multiple changes in the output signal may be necessary during a period of the write clock signal. Disadvantages of the multiplexer structure are that a blocking time is necessary to switch the multiplexers, and the circuit functions asynchronously and requires a downstream output stage, which turns the pulses on and off with the different selected signals. Moreover, additional runtime optimization of the signals within the multiplexers and output circuit is necessary. If several pulses are to be generated within a clock period, a costly circuit is necessary. Furthermore, a collision strategy is necessary, if two or more pulses are to superimpose within a clock period.

SUMMARY OF THE INVENTION

It is therefore an object of the present invention is to provide an improved method and an improved pulse generator, with which start times and end times of individual pulses can be generated as a pulse sequence with the indicated time resolution without the aforementioned disadvantages.

This object is achieved with a method by providing pairs of one first clock signal and one second clock signal, by generating partial pulses from the properties of the first and second clock signal of a pair in accordance with a timing vector, and by generating the pulse train by superimposition of partial pulses.

Furthermore, this object is achieved with a pulse generator in that the pulse generator has a phase-locked loop, which has outputs for clock signals, the pulse generator further has a timing vector generator, the pulse generator provides pairs of one first clock signal and one second clock signal and generates a partial pulse from the first and second clock signal of a pair in accordance with a timing vector, and the pulse generator generates the pulse train by superimposition of partial pulses.

If M clock signals, for example, 16 or 64 clock signals, are required, the phase-locked loop accordingly has M=16 or 64 outputs.

Advantages of this approach result from the simple architecture of the pulse generator, which therefore even itself represents an advantage. The required timing vector is regenerated synchronously to the 0th clock signal, therefore, for example, synchronously to a write clock signal and with its frequency. Each timing vector contains information on the phase positions of all additional clock signals. Attention must be focused on the same runtime of all paths only in the generation of the partial pulses and the superimposition of the partial pulses, where each path extends from the generation of the clocks to the common output.

Several pulses can be generated within a clock period of the first clock signal by suitable design of the timing vector, for example, by an OR operation of the timing vector components. The timing vector itself moreover can be generated time-uncritically. A collision strategy is therefore not necessary at the runtime-critical output of the pulse generator, but rather can be integrated into the timing vector, which can be generated time-uncritically.

In contrast to a circuit, which has multiplexers, neither a blocking time for the switching of the multiplexers nor an additional output circuit for further processing of selected clock signals is necessary. For this reason, the need for runtime compensation in this output circuit is also not necessary.

In regard to embodiments of the method, it is preferred that the predefined properties comprise that the clock signals of the selected pair are at times the same and at times different.

A pulse duty ratio of a binary 0th clock signal is typically 50%, so that the time width of pulses of the 0th clock signal corresponds to half of its period duration. During the generation of partial pulses, far shorter widths of partial pulses can be generated by the indicated selection of properties; this leads to an increase in the number of partial pulse edges lying within a period of the 0th clock signal. As a result, this improves the time resolution and thereby the accuracy with which the start times and end times of individual pulses of the pulse train can be adjusted.

Furthermore, one of the two clock signals of the pair can be inverted and a width of a partial pulse can be defined as the time span during which the inverted clock signal and the non-inverted clock signal are the same.

This embodiment also provides a possibility, which is simple to realize in terms of circuitry engineering, for providing short time spans. The time span corresponds precisely to the shift of the phases of the two clock signals.

A partial pulse can be generated by an AND operation of the inverted clock signal with the non-inverted clock signal and a component of the timing vector.

The AND operation of three signals results in a simple realization of partial pulse generation in accordance with the timing vector. Coupling of the inverted and non-inverted additional clock signals produces a potential width of the partial pulse and coupling with the vector component to a certain extent determines whether this partial pulse is activated, and/or selected.

In another embodiment, M−1 additional clock signals are provided that are generated from the 0th clock signal, the clock signals of a pair have a phase shift relative to each other, which is greater or equal to the 1/M-fold value of the period duration of the 0th clock signal.

This embodiment in the alternative, in which the phase shift is equal to the 1/M-fold value of the period duration of the 0th clock signal, realizes a theoretically minimal width of partial pulses, which corresponds substantially simultaneously to the theoretically minimal width of an individual pulse of the pulse train. These theoretically shortest partial pulses follow one another without overlapping, which under appropriate circumstances with real superimposition may lead to short gaps as a result of the superimposition. For this reason, for cases which do not involve the shortest possible width of a partial pulse, it is better to use a greater phase shift, therefore the i-fold value of 1/M, where i=0, 1, 2, . . . M−1 numbers the clock signals. The width of the partial pulses is then extended by the same factor, which in the end leads to overlapping of different partial pulses. Gaps in the result of the superimposition of such partial pulses are thereby avoided. The greater phase shift between the additional clock signals of a pair changes only the width of the partial pulses, but not the minimal phase shift between two partial pulses. The fineness of the grid pitch is therefore retained.

It is preferable thereby that for numbers of $M \neq 2^n$ inputs of a symmetric OR operation tree structure, which leads to a common output node of the pulse generator, the unnecessary inputs of the tree structure are set to logic zero.

This embodiment permits for each M a superimposition of the partial pulses through a symmetric OR operation tree structure, which leads to the same path lengths in the processing of all clock signals up to a common output node of the pulse generator.

Another embodiment is characterized by the superimposition of the partial pulses occurring by an OR operation.

This operation combines the individual pulses of the pulse train with the time resolution, achieved by the fineness of the subdivision of the periods of the 0th clock signal into M additional clock signals, from the partial pulses previously selected in accordance with the timing vector.

In view of the embodiments of the pulse generator, it is preferred that it inverts one of the two clock signals of a pair and defines a width of a partial pulse as the time span during which the inverted and non-inverted clock signals are the same.

For this embodiment of a device, the same advantages result as in the corresponding embodiment of the method in conjunction with a realizability, simple in terms of circuitry engineering, of components, such as logic gates, typically found on the market. This applies similarly to the additional embodiments, described hereafter, of the pulse generator.

Another preferred embodiment has at least one AND gate, which couples the clock signal with the inverted clock signal and a component of the timing vector.

The phase-locked loop can have a ring oscillator with M outputs for clock signals, each of which have a phase shifted by the i/M-fold value of the period duration of the 0th clock signal relative to the phase of the 0th clock signal, where i numbers the clock signals continuously from zero to M−1.

Another embodiment provides a tree structure of OR gates, with first OR gates, which couple the output signals of two AND gates each, and additional OR gates, which in each case couple output signals of two OR gates to one another in such a way that there is a path to a common output of the tree structure for each of the clock signals, where each path has the same number of OR gates.

It is noted that the path length, represented here to a certain extent as the number of logic gates, is the same for each of the additional clock signals up to the common output, so that measures for runtime compensation are not necessary.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
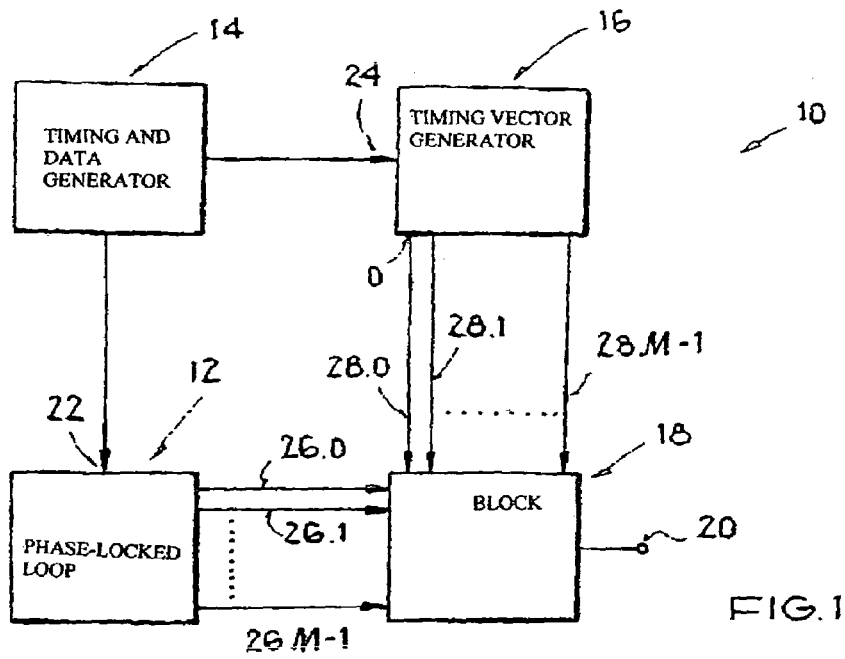
FIG. 1 shows a pulse generator according to an embodiment of the present invention.

FIG. 1 shows a pulse generator 10 with a phase-locked loop 12, a timing and data generator 14, a timing vector generator 16, and a block 18, which couples components of a timing vector with output signals of the phase-locked loop 12 to form a pulse train, which is provided at the output 20 of the pulse generator 10. Timing and data generator 14 can be, for example, a programmable computer with memory elements and produces a 0th clock signal at a clock signal input 22 of phase-locked loop 12, as well as a data signal at a data input 24 of timing vector generator 16. The phase-locked loop 12 generates from the 0th clock signal a clock signal of the same phase and additional clock signals, each of which have the frequency of the 0th clock signal and whose phase is shifted in each case relative to the phase of the 0th clock signal.

The 0th clock signal and M−1 additional clock signals are supplied via clock signal connections 26.0, 26.1, . . . , 26.M−1 to block 18. Moreover, M components of a timing vector generated by timing vector generator 16 are supplied to block 18 via connections 28.0, 28.1 . . . , 28.M−1. In so doing, the transmission of the M vector components occurs phase-coupled with the frequency of the 0th clock signal, so that M individual vector components can be provided for each period of the 0th clock signal. Instead of a parallel transmission of the vector components, a serial transmission may also be used.

Block 18 assumes the function of providing pairs of one first clock signal and one second clock signal from the supplied clock signals, of generating a partial pulse from the first and second clock signal of a pair in accordance with the supplied vector components and thereby in accordance with the timing vector, and further of generating the desired pulse train by superimposition of partial pulses and of providing them at output 20 of the pulse generator. The adjustment of start times and end times of individual pulses of the pulse train is explained further below with reference to FIGS. 3 and 4.

Figure 2:
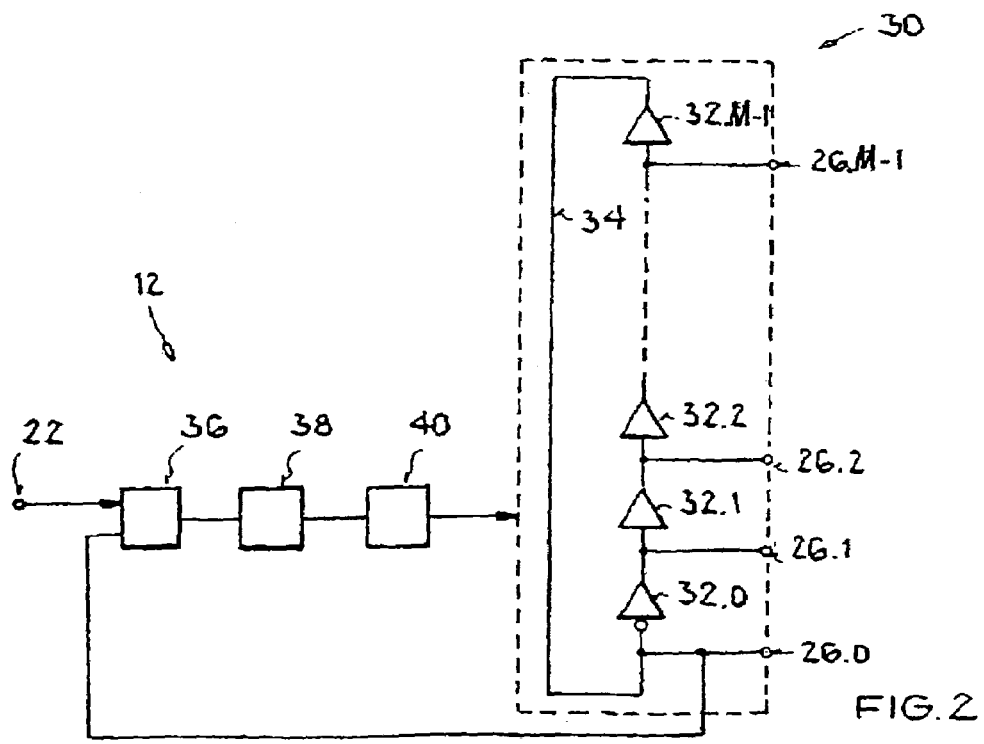
FIG. 2 illustrates a phase-locked loop, which generates M additional clock signals from a 0th clock signal.

First, however, with reference to FIG. 2, a phase-locked loop 12 is explained, which generates additional clock signals from a 0th clock signal applied at clock signal input 22, in addition to the 0th clock signal M−1; the additional clock signals each have the frequency of the 0th clock signal and their phase is shifted in each case relative to the phase of the 0th clock signal.

Phase-locked loop 12 initially has a voltage-controlled oscillator VCO 30, which may be made, for example, as a ring oscillator from a chain comprising an inverting amplifier 32.0 and M−1 additional amplifiers 32.1, . . . , 32.M−1, the chain being closed into a ring by a connection 34. One of the clock signal connections 26.0, 26.1, . . . , 26.M−1 is connected between two amplifiers each from the chain of amplifiers 32.0, 32.1, . . . 32.M−1. Each of the amplifiers 32.0, 32.1, . . . 32.M−1 passes a signal level change, occurring at its input, with a delay to its output, so that the clock signal connections 26.0, 26.1, . . . , 26.M−1 are supplied with a total of M clock signals, each being phase-shifted.

Phase-locked loop 12 furthermore has a phase/frequency comparator 36, a charge pump 38, and a loop filter 40. Phase/frequency comparator 36 compares the 0th clock signal applied at input 22 of the phase-locked loop 12 with a feedback signal decoupled from the ring and, depending on the comparison result, controls a charge by charge pump 38 or discharge of a capacitor integrated into the charge pump. The voltage changing with the charges across the capacitor is smoothed by loop filter 40 and used for controlling VCO 30. Through the closed control loop, the clock signal fed into clock signal connection 26.0 therefore builds up to the frequency and phase of the 0th clock signal, which is supplied to input 22 of phase-locked loop 12. The rest of the M−1 clock signals based on the arrangement build up to the same frequency with a shifted phase in each case.

It is understood that phase-locked loop 12 can also be realized in a different way. Preferably, it is designed in such a way that it has an input 22 for the 0th clock signal and M outputs for the clock signals, each of which have a phase shifted by the i/M-fold value of the period duration of the 0th clock signal relative to the phase of the 0th clock signal, where i numbers the clock signals continuously from i=0 to M−1. So-called delayed locked loops (DLL) with these features are therefore also to be subsumed, for example, under the term employed here of the phase-locked loop.

Figure 3:
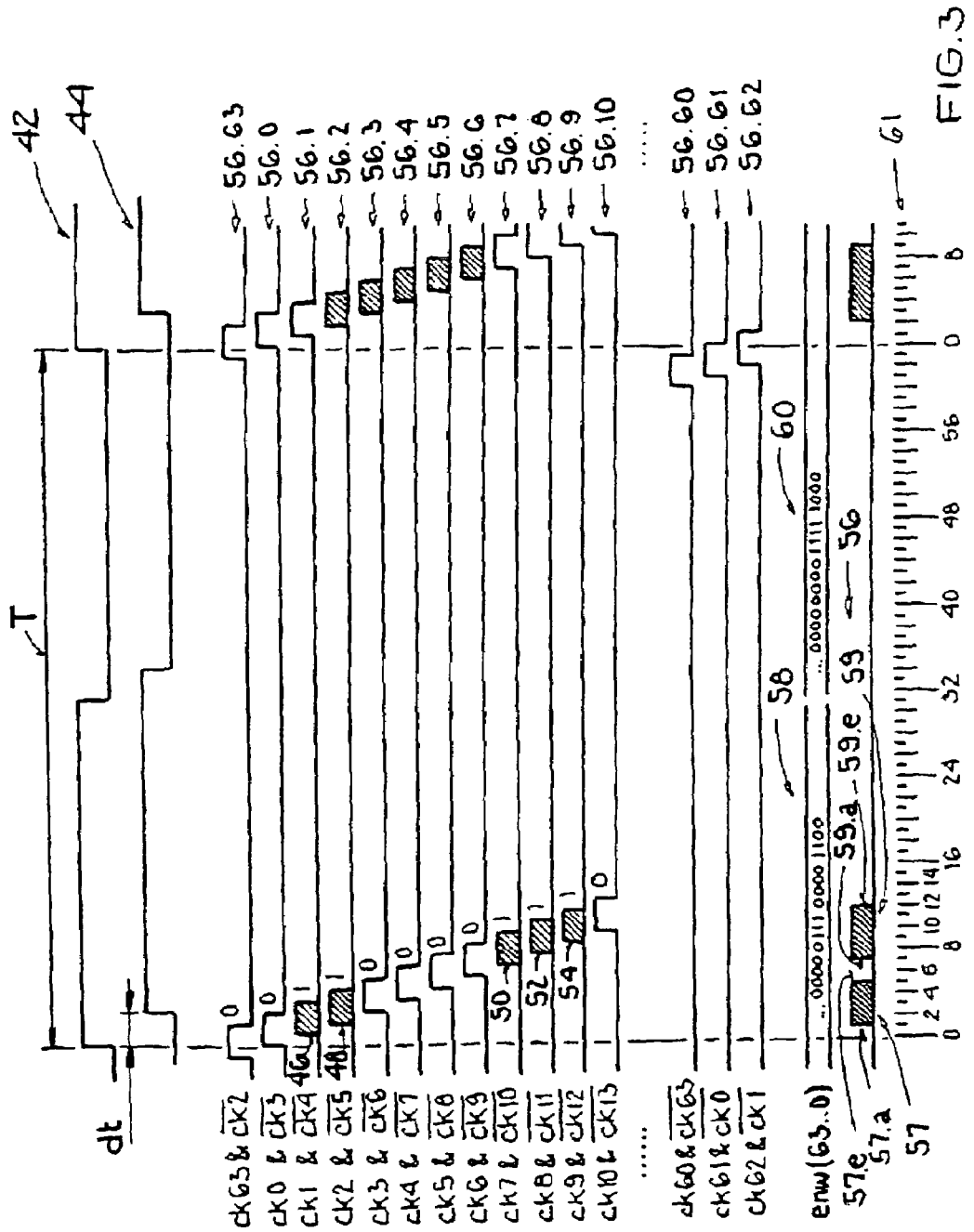
FIG. 3 illustrates time courses of a 0th clock signal, additional clock signals, partial pulses generated therefrom according to an embodiment of the method with indication of timing vector components, a resulting pulse train, and a grid, which explains the time resolution.

FIG. 3 shows time courses of a 0th clock signal 42 and, representing all additional clock signals, additional clock signal 44, partial pulses 46, 48, . . . , 54 generated therefrom in accordance with a timing vector with indication of timing vector components, a resulting pulse train 56, and a grid 61, which explains the time resolution. Here, the diagram in FIG. 3 is based on the value M=64. The 0th clock signal 42 has a period duration T and a pulse duty ratio of 50 percent. The additional clock signal 44 in the depicted case is the third clock signal and accordingly has a phase shift dt of ((i=3)/64)*T. The phase shift dt corresponds precisely to a time span, in which the 0th clock signal 42 and the inverted third clock signal 44 are the same.

Accordingly, for 64 clock signals ck0 to ck63 in all 64 time spans can be formed, in that, for example, in each case a first clock signal cki and an inverted second clock signal ckj are joined with i, j elements (0, 1, . . . , 63) to form a pair, where the i and j of a pair in each case number clock signals shifted by 3 dt. It is understood that the pairs can also be realized with other values for the shift, e.g., dt, 2 dt, 5 dt, etc.

In FIG. 3, the inverted signals ckj are marked by a horizontal line. The results of an AND operation of the clock signals of the different pairs are shown in FIG. 3 as signal characteristics 56.0, 56.1, . . . 56.63. These signal characteristics 56.0, 56.1, . . . 56.63 each show phase-shifted partial pulses with width dt. In accordance with a timing vector enw=(enw63, enw62, . . . , enw0), the partial pulses 46, 48, . . . , 54 are generated from the signals, and/or signal characteristics 56.0, 56.1, . . . 56.63.

In FIG. 3, vector components of two consecutive timing vectors 58, 60 in two consecutive periods of the 0th clock signal are shown incompletely. For reasons of clarity, the components of timing vector 58 are shown in addition to the signal characteristics 56.0, 56.1, . . . 56.63. Whenever a vector component, belonging to a time span dt, has the value 1, a partial pulse 46, 48 . . . , 54 is generated. For the rest of the vector components, which have the value 0, in contrast, no partial pulse is generated. The partial pulses 46, 48, . . . 54 in this embodiment are therefore generated by an AND operation of a first clock signal and a second inverted second clock signal and a component of the timing vector 58.

Next, the partial pulses 46, 48, . . . , 54 are superimposed to form the pulse train 56, which occurs, for example, by an OR operation of the partial pulses 46, 48, . . . , 54. Start times 57.a, 59.a and end times 57.e, 59.e of individual pulses 57, 59 of the pulse train 56 can therefore be adjusted with a fineness corresponding to the distance of the start times or end times of two consecutive partial pulses of the signal characteristics 56.0, 56.1, . . . 56.63. This distance defines a grid pitch of the time resolution, which corresponds to the 1/M-fold value of the period duration T of the 0th clock signal. The grid 61 in FIG. 3 accordingly has a grid pitch of a 64th part of the period duration T.

Figure 4:
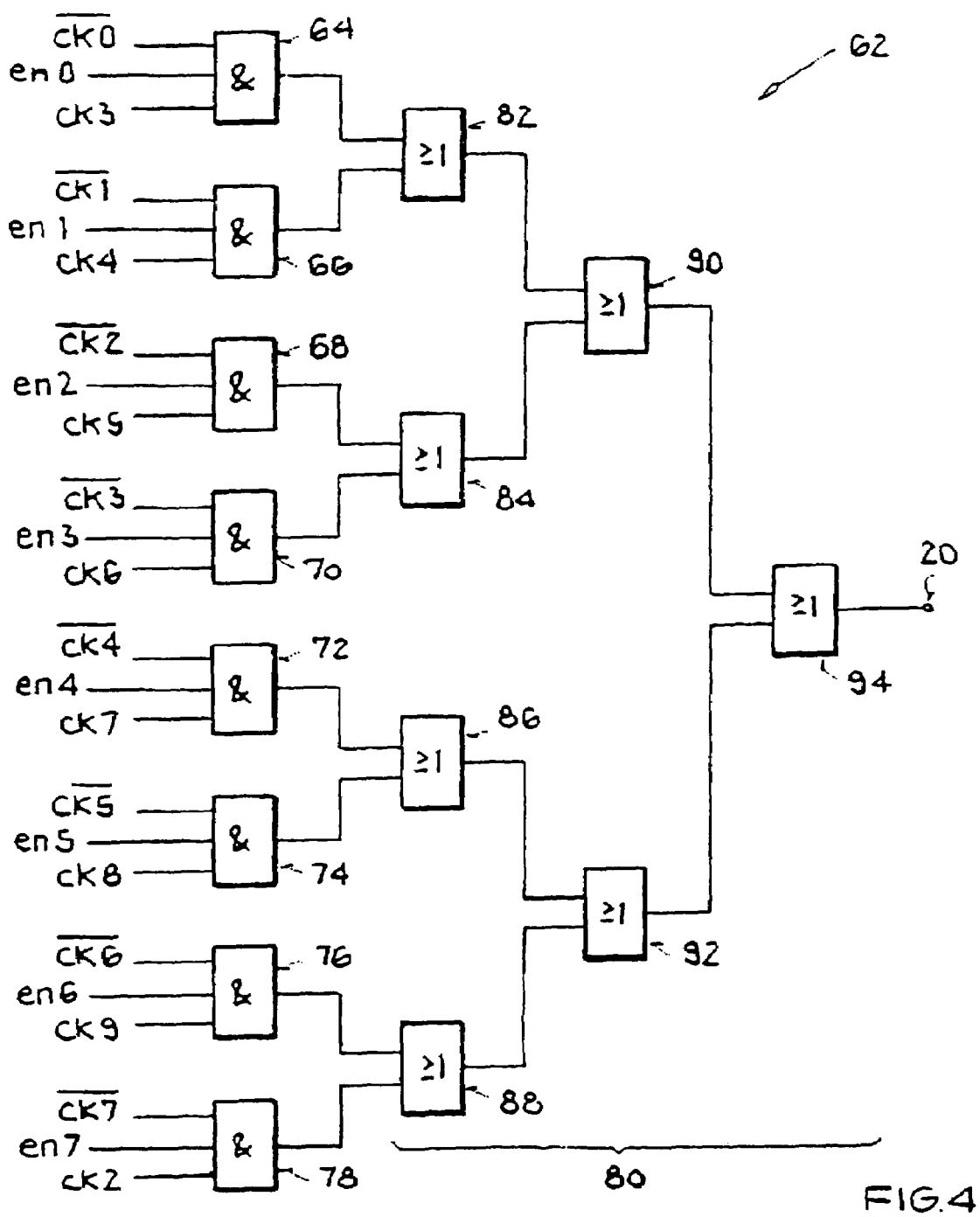
FIG. 4 shows a structure of logic gates, which couple clock signals to one another and with components of a timing vector to the desired pulse train.

FIG. 4 shows a structure 62 of logic gates, which couples clock signals to one another and with components of a timing vector to the desired pulse train. In this regard, the diagram in FIG. 4 for reasons of clarity refers to the case M=8. Structure 62 is integrated into block 18 of FIG. 1 and produces a pulse train at output 20. To generate the pulse train, structure 62 has M=8 AND gates 64, 66, . . . , 78, which in each case couple a first clock signal of a pair of clock signals with a second clock signal of the pair of clock signals and a component en0, en1 . . . of a timing vector. In this regard, the second clock signal is generated by inversion of a clock signal.

Each clock signal is used both in non-inverted form and also in inverted form, whereby the non-inverted clock signal is supplied to a different AND gate than the clock signal arising by means of inversion. The inverted clock signals in FIG. 3 are also marked with a horizontal line. The 0th clock signal ck0 in inverted form is coupled, for example, in AND gate 64 with a non-inverted clock signal ck3 and the vector component en0. In addition, the 5th clock signal in inverted form together with the non-inverted clock signal ck8 and the vector component en5 are coupled by AND gate 74. A similar situation applies to the rest of the clock signals and AND gates.

In accordance with the employed timing vector, time signal characteristics with partial pulses according to FIG. 3 therefore arise at the outputs of the AND gates 64, 66, 68, 70, 72, 74, 76, 78. These partial pulses are superimposed by a tree structure 80 from OR gates 82, 84, . . . , 94 to form a pulse train, as is shown in FIG. 3 for M=64 as pulse train 56. In this regard, tree structure 80 has first OR gates 82, 84, 86, 88, which couple the output signals of two AND gates each 64, 66, 68, 70, 72, 74, 78. Furthermore, they have other OR gates 90, 92, 94, which in each case couple output signals from two OR gates 82, 84, 86, 88, 90, 92 to one another in such a way that there is a path to a common output 20 of the tree structure 80 for each of the additional clock signals, where each path has the same number of OR gates 82, 84, 86, 88, 90, 92.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for generating a pulse train with adjustable start times and end times of individual pulses, the method comprising the steps of:
    generating additional clock signals from a 0th clock signal, each additional clock signal having the frequency of the 0th clock signal and being phase shifted relative to a phase of the 0th clock signal;
    providing pairs of one first clock signal and one second clock signal to thereby generate partial pulses from predefined properties of the first and second clock signal of a pair in accordance with a timing vector; and
    generating the pulse train by superimposition of the partial pulses.

2. The method according to claim 1, wherein the predefined properties are formed in that the clock signals of a selected pair are at times the same and at times different.

3. The method according to claim 2, wherein one of the two clock signals of the pair is inverted and a width of a partial pulse is defined as a time span during which the inverted clock signal and the non-inverted clock signal are the same.

4. The method according to claim 3, wherein a partial pulse is generated by an AND operation of the inverted clock signal with the non-inverted clock signal and a component of the timing vector.

5. The method according to claim 1, wherein M is a number of clock signals, and
    wherein, for M−1 additional clock signals, generated from the 0th clock signal, the clock signals of a pair have a phase shift relative to each other, which is greater or equal to the 1/M-fold value of the period duration of the 0th clock signal.

6. The method according to claim 5, wherein, for numbers of $M \neq 2^n$ inputs of a symmetric OR operation tree structure, which leads to a common output node of the pulse generator, unnecessary inputs of the tree structure are set to logic zero.

7. The method according to claim 1, wherein the superimposition of the partial purses occurs by at least one OR operation.

8. The method according to claim 1, wherein one of the two clock signals of the pair is inverted and a width of a partial pulse is defined as a time span during which the inverted clock signal and the non-inverted clock signal are the same.

9. The method according to claim 8, wherein a partial pulse is generated by an AND operation of the inverted clock signal with the non-inverted clock signal and a component of the timing vector.

10. A pulse generator for generating additional clock signals from a 0th clock signal, each additional clock signal have a frequency of the 0th clock signal and having a phase shifted in each case relative to a phase of the 0th clock signal, the pulse generator of the additional clock signals generating at least one pulse train with adjustable start times and end times of individual purses of the pulse train, wherein the pulse generator comprises:
    a phase-locked loop, which has an input for the 0th clock signal and outputs for the additional clock signals; and
    a timing vector generator,
    wherein pairs of one first clock signal and one second clock signal are provided and a partial pulse is generated from the first and second clock signal of a pair in accordance with a timing vector, and
    wherein the pulse train is generated by superimposition of the partial pulses.

11. The pulse generator according to claim 10, wherein the pulse generator inverts one of the two clock signals of a pair and defines a width of the partial pulse as a time span during which the inverted clock signals and the non-inverted clock signals are the same.

12. The pulse generator according to claim 10, further comprising at least one AND gate, which couples the clock signal with the inverted clock signal and a component of the timing vector.

13. The pulse generator according to claim 10, further comprising a phase-locked loop having a ring oscillator with M outputs for clock signals, each of which have a phase shifted by the i/M–fold value of the period duration of the 0th clock signal relative to the phase of the 0th clock signal, where i numbers the clock signals continuously from i =0 to M−1.

14. The pulse generator according to claim 10, wherein the superimposition comprises a tree structure of OR gates having first OR gates, which couple output signals of two AND gates each, and having additional OR gates, which in each case couple output signals of two OR gates to one another so that there is a path to a common output of the tree structure for each of the additional clock signals, where each path has the same number of OR gates.

15. A pulse generator for generating additional clock signals from a 0th clock signal, each additional clock signal have a frequency of the 0th clock signal and having a phase shifted in each case relative to a phase of the 0th clock signal, the pulse generator of the additional clock signals generating at least one pulse train with adjustable start times and end times of individual pulses of the pulse train, wherein the pulse generator comprises:
    a phase-locked loop, which has an input for the 0th clock signal and outputs for the additional clock signals; and
    a timing vector generator for generating a timing vector synchronously to the $0^{th}$ clock signal,
    wherein pairs of one first clock signal and one second clock signal are provided and a partial pulse is generated from the first and second clock signal of a pair in accordance with the timing vector, and
    wherein the pulse train is generated by superimposition of the partial pulses.

16. The pulse generator according to claim 15, wherein the pulse generator inverts one of the two clock signals of a pair.

17. The pulse generator according to claim 16, wherein the pulse generator defines a width of the partial pulse as a time span during which the inverted clock signals and the non-inverted clock signals are the same.

18. The pulse generator according to claim 15, further comprising at least one AND gate, which couples the clock signal with the inverted clock signal and a component of the timing vector.

19. The pulse generator according to claim 15, further comprising a phase-locked loop having a ring oscillator with M outputs for clock signals, each of which have a phase shifted by the i/M-fold value of the period duration of the 0th clock signal relative to the phase of the 0th clock signal, where i numbers the clock signals continuously from i=0 to M−1.

20. The pulse generator according to claim 15, wherein the superimposition comprises a tree structure of OR gates having first OR gates, which couple output signals of two AND gates each, and having additional OR gates, which in each case couple output signals of two OR gates to one another so that there is a path to a common output of the tree structure for each of the additional clock signals, where each path has the same number of OR gates.

* * * * *